(12) United States Patent
Takesako

(10) Patent No.: US 9,385,112 B1
(45) Date of Patent: Jul. 5, 2016

(54) SEMICONDUCTOR DEVICES

(71) Applicant: Micron Technology, Inc., Boise, ID (US)

(72) Inventor: Kazuaki Takesako, Tokyo (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 14/746,306

(22) Filed: Jun. 22, 2015

(51) Int. Cl.
    *H01L 29/40* (2006.01)
    *H01L 27/02* (2006.01)
    *H01L 27/105* (2006.01)

(52) U.S. Cl.
    CPC .......... *H01L 27/0207* (2013.01); *H01L 27/105* (2013.01)

(58) Field of Classification Search
    CPC ........................ H01L 27/0207; H01L 27/105
    USPC ......................................................... 257/621
    See application file for complete search history.

(56) References Cited

U.S. PATENT DOCUMENTS

| | | | |
|---|---|---|---|
| 7,595,529 B2 | 9/2009 | Kim et al. | |
| 8,154,102 B2 | 4/2012 | Matsuda et al. | |
| 8,580,649 B2 | 11/2013 | Miyahara et al. | |
| 2004/0018725 A1* | 1/2004 | Cho | G11C 11/412 438/672 |
| 2006/0157817 A1* | 7/2006 | Yaegashi | H01L 27/105 257/510 |
| 2012/0034757 A1 | 2/2012 | Choi et al. | |
| 2012/0086084 A1 | 4/2012 | Kikuchi | |
| 2013/0241027 A1* | 9/2013 | Kwak | H01L 29/0649 257/506 |
| 2014/0134824 A1 | 5/2014 | Chen et al. | |

FOREIGN PATENT DOCUMENTS

| | | |
|---|---|---|
| JP | 2008-205477 | 9/2008 |
| JP | 2010-166026 | 7/2010 |
| JP | 2012-099793 | 5/2012 |
| JP | 2012-231007 | 11/2012 |
| JP | 2014-138053 | 7/2014 |

OTHER PUBLICATIONS

U.S. Appl. No. 14/852,852, filed Sep. 14, 2015, Tomoyama.

* cited by examiner

*Primary Examiner* — Long K Tran
(74) *Attorney, Agent, or Firm* — Wells St. John, P.S.

(57) ABSTRACT

A semiconductor device includes a substrate having laterally-adjacent first and second substrate regions. A first isolation region is at least in the first substrate region. An active region is at least in the second substrate region. The active region is laterally adjacent to the first isolation region. A conductive line extends from the first substrate region into the second substrate region. The conductive line is over the first isolation region and over the active region. A top surface of the conductive line over the first isolation region in the first substrate region is lower in the substrate than an elevationally outer surface of active material of the active region in the second substrate region. A top surface of the conductive line over the active region in the second substrate region is higher in the substrate than the elevationally outer surface of the active material of the active region in the second substrate region. A conductive via extends elevationally inward at least to elevation of the higher top surface of the conductive line elevationally over the active region in the second substrate region. Additional embodiments are disclosed.

12 Claims, 16 Drawing Sheets

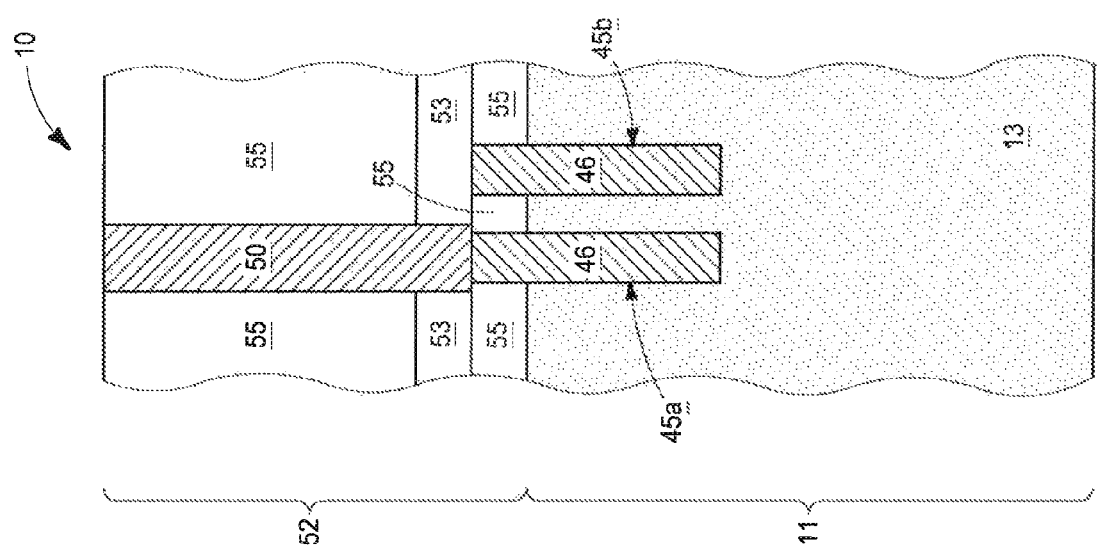

US 9,385,112 B1

SEMICONDUCTOR DEVICES

TECHNICAL FIELD

Embodiments disclosed herein pertain to semiconductor devices.

BACKGROUND

A continuing goal in integrated circuitry fabrication is to make ever smaller and closer packed circuit components. As integrated circuitry density has increased, there is often greater reduction in the horizontal dimension of circuit components as compared to the vertical dimension. In many instances, the vertical dimension has increased. As size decreases and density increases, there is a continuing challenge to provide sufficient conductive contact area between electrically coupled circuit components particularly where that coupling is through contacting surfaces that are substantially horizontal. For example, elevationally elongated conductive vias formed in contact openings are commonly used for electrically coupling circuit components that are at different elevations relative to one another. The contact openings may need to be etched through dielectric material to different elevations within the substrate, and which can be problematic. As circuit components become smaller and closer together, it becomes increasingly difficult to control critical dimension, mask alignment, and provide acceptable margins of error when forming contact openings to lower elevation circuit components.

Different regions of semiconductor devices (e.g., integrated circuits) are commonly laterally separated from one another by vertically-extending dielectric isolation regions formed in bulk or other semiconductor material. Additionally, vertically-extending isolation regions may be formed within an individual region to electrically separate circuit components therein (e.g., within a region comprising a plurality of closely-spaced repeating components). Those isolation regions may be laterally narrower than vertical isolation regions used primarily to electrically separate larger and/or different circuitry regions of the substrate from one another. Nevertheless, all such vertical isolation regions are typically formed at the same time initially by etching followed by subsequent fill with one or more dielectric materials. In some instances, the fill material is initially liquid, partially fills the individual trenches, and is subsequently hardened. Additional solid dielectric material is deposited over the solidified dielectric material. The substrate is then typically subjected to annealing conditions towards achieving a desired finished composition and structure for the dielectric isolation material. Such processing can produce different lateral stresses in semiconductor material of the substrate in part due to typical different lateral widths of these isolation regions. This may lead to dislocations or other adverse attributes in semiconductor material of the substrate.

Memory is one type of integrated circuitry commonly incorporating conductive vias and vertical isolation regions. Integrated memory is usually fabricated in one or more arrays of individual memory cells. The memory cells might be volatile, semi-volatile, or nonvolatile. Nonvolatile memory cells can store data for extended periods of time in the absence of power. Nonvolatile memory is conventionally specified to be memory having a retention time of at least about 10 years. Volatile memory dissipates, and is therefore refreshed/rewritten to maintain data storage. Volatile memory may have a retention time of milliseconds, or less. The memory cells are configured to retain or store memory in at least two different selectable states. In a binary system, the states are considered as either a "0" or a "1". In other systems, at least some individual memory cells may be configured to store more than two levels or states of information.

BRIEF DESCRIPTION OF THE DRAWINGS

FIG. 16 is an enlarged sectional view taken through line 16-16 in FIG. 1.

DETAILED DESCRIPTION OF EXAMPLE EMBODIMENTS

Figure 1:
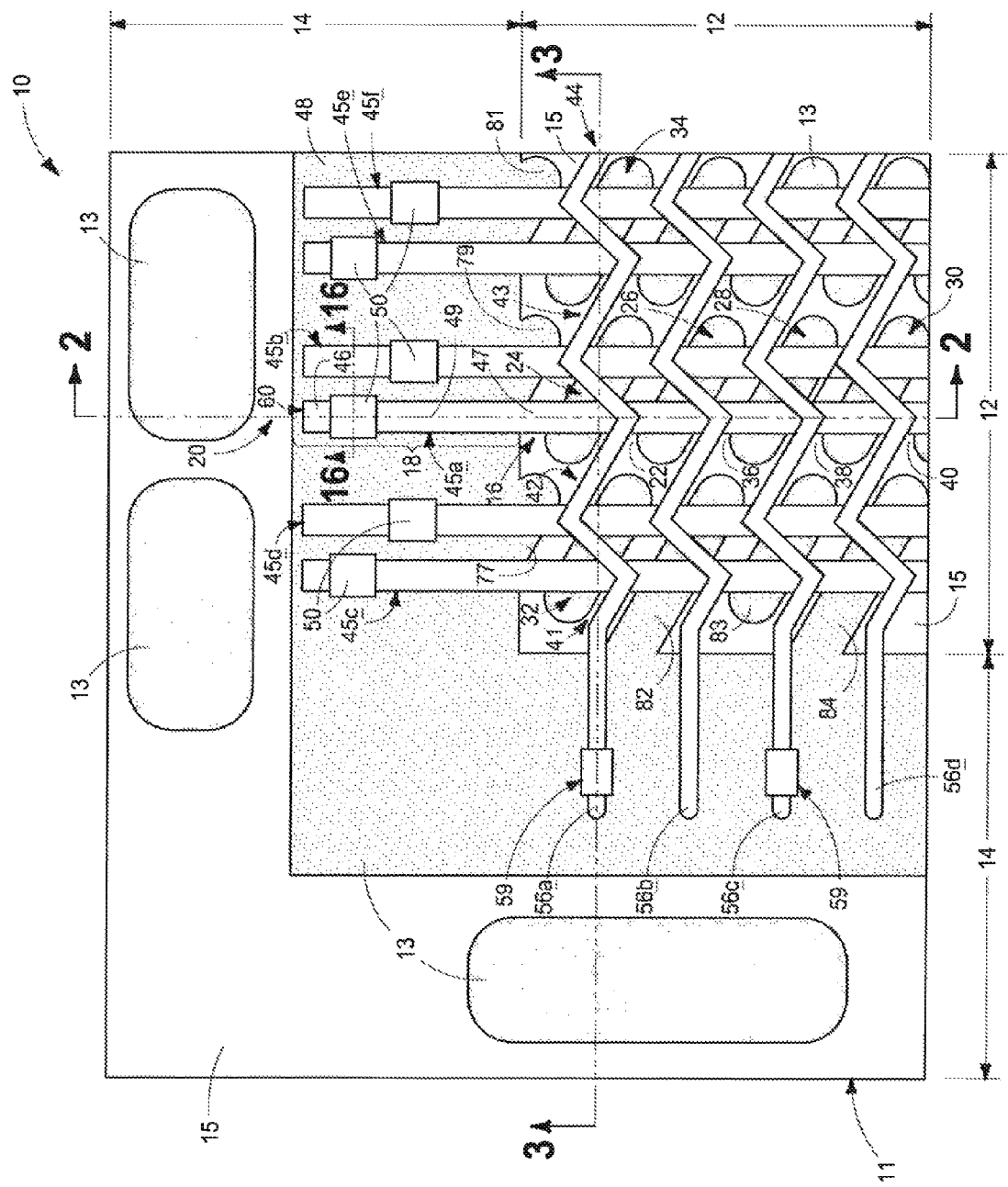
FIG. 1 is a diagrammatic top plan view of a substrate fragment comprising a portion of a semiconductor device in accordance with an embodiment of the invention.

Example semiconductor devices in accordance with some embodiments of the invention are initially described with reference to FIGS. 1-3 with respect to a substrate fragment 10, and which may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate fragment 10 comprises a base or substrate 11 showing various materials having been formed there-over and there-within. Materials may be aside, elevationally inward, or elevationally outward of the FIG. 1-depicted materials. Substrate 11 may comprise any one or more of conductive (i.e., electrically herein), semiconductive, or insulative/insulator (i.e., electrically herein) materials. Any of the materials and/or structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples. Dielectric materials 52, 53, and 55 (referred to below) shown in the FIG. 2 and FIG. 3 cross sections are not shown in FIG. 1 for clarity in FIG. 1.

Substrate 10 comprises a first substrate region 12 and a laterally-adjacent second substrate region 14. In one embodiment, first substrate region 12 comprises an array circuitry region and second substrate region 14 comprises a peripheral circuitry region encircling array circuitry region 12. Only a portion of one corner of an example array circuitry region and encircling peripheral circuitry region are shown in FIG. 1 for clarity. In one embodiment, first substrate region 12 comprises a memory array comprising memory cells of memory circuitry and second substrate region 14 comprises peripheral circuitry configured to at least one of write to and read from the memory cells of the memory array. Any existing or yet-to-be-developed memory cells may be constructed, for example dynamic random access memory, phase change memory, resistive random access memory, magnetic random access memory, flash memory, etc.

An isolation region 16 (sometimes referred to as a first isolation region) is at least in first substrate region 12 and an active region 18 is at least in second substrate region 14 laterally adjacent to isolation region 16 (e.g., regions 16 and 18 being under a conductive line 45a as described below). Active region 18 comprises active material 13. An example is bulk monocrystalline silicon that has been suitably doped to a desired background conductivity-modifying state to provide desired semiconductive properties. In this document, "active material" is a semiconductor material whether undoped or doped with a conductivity-modifying impurity to any desired degree and whether the resultant material is semiconductive or conductive. Although FIGS. 1-3 depict active material 13 essentially as comprising bulk semiconductor material, semiconductor-on-insulator substrates and other substrates may be used, and whether existing or yet-to-be-developed. First isolation region 16 may comprise insulator material 15 (e.g., dielectric material), with examples being silicon nitride and silicon dioxide whether doped or undoped. In one embodiment and as shown, a second isolation region 20 is in second substrate region 14. In one embodiment, active region 18 is laterally adjacent to first isolation region 16 and second isolation region 20 and laterally spans there-between (e.g., an example spanning width for region 18 being about 3,700 to 4,400 Angstroms, and for region 20 about 800 to 1,500 Angstroms). Second isolation region 20 and other isolation regions may have any of the attributes described above with respect to first isolation region 16. In one embodiment and as shown, the isolation regions comprise trench isolation regions, for example shallow trench isolation regions (e.g., an example depth in material 13 being about 3,000 Angstroms). FIG. 2 diagrammatically shows isolation regions 16 and 20 as having straight vertical sidewalls, although non-straight and/or non-vertical sidewalls may be used. In this document, "horizontal" refers to a general direction along a primary surface relative to which the substrate is processed during fabrication, and "vertical" is a direction generally orthogonal thereto. Further, "vertical" and "horizontal" as used herein are generally perpendicular directions relative one another independent of orientation of the substrate in three-dimensional space. Further in this document, "elevational", "upper", "lower", "top", and "bottom" are with reference to the vertical direction relative to a base substrate upon which the circuitry is fabricated.

Figure 2:
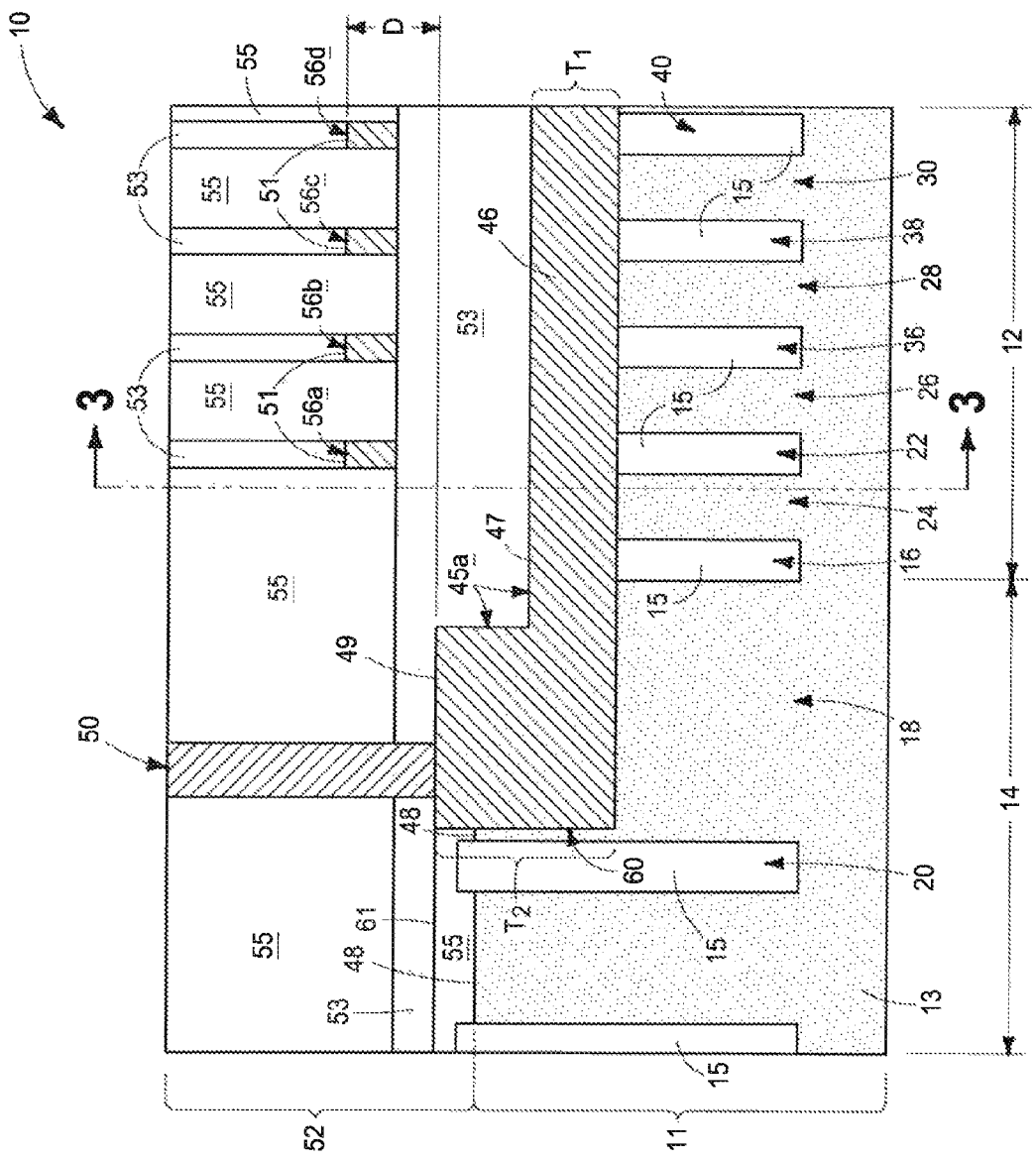
FIG. 2 is a sectional view taken through line 2-2 in FIG. 1 and FIG. 3.
Figure 3:
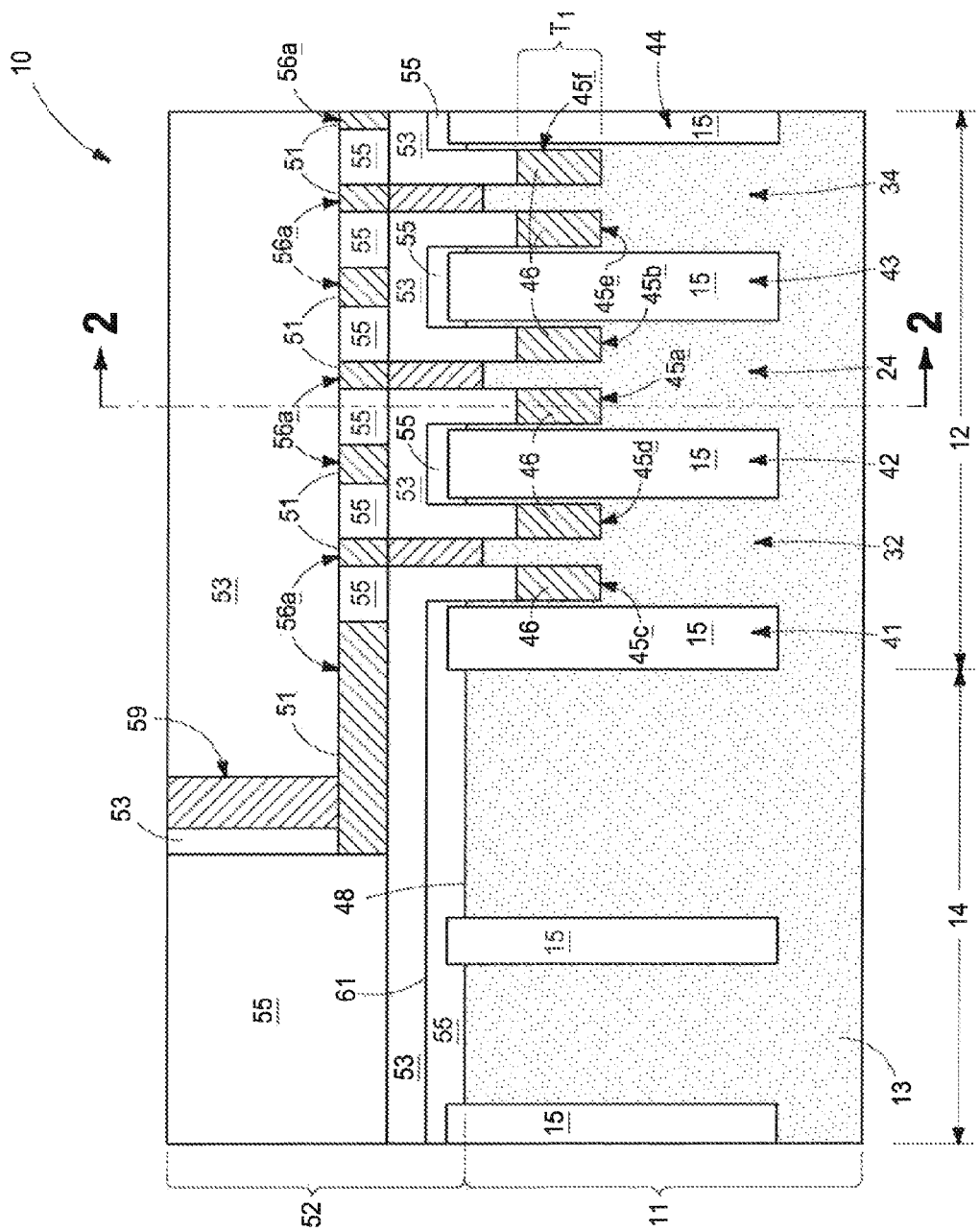
FIG. 3 is a sectional view taken through line 3-3 in FIG. 1 and FIG. 2.

FIGS. 1-3 collectively show active regions 24, 26, 28, 30, 32, 34, 77, 79, 81, 82, 83, and 84 (and others not numerically designated), and isolation regions 16, 20, 22, 36, 38, 40, 41, 42, 43, and 44 (and others not numerically designated). Accordingly and in one embodiment, an array of active regions 24, 26, 28, 30, 32, 34, 77, 79, 81, 82, 83, and 84 are laterally spaced from one another within a sea of isolation material 15 within first substrate region 12 that comprises isolation regions 16, 22, 36, 38, 40, 41, 42, 43, and 44. Providing isolation region 20 in substrate region 14 to be closer in width to those of the isolation regions between the active regions in substrate region 12 may minimize different lateral stress being induced in active material 13 during fabrication.

A conductive line 45a extends from first substrate region 12 into second substrate region 14 elevationally over first isolation region 16 and elevationally over active region 18. Multiple conductive lines 45a, 45b, 45c, 45d, 45e, and 45f are shown, although the discussion largely proceeds referring to single conductive line 45a. For purposes of the continuing discussion, conductive line 45a may be considered as comprising a top (i.e., elevationally outermost herein) surface 47 elevationally over first isolation region 16 in first substrate region 12 and a top surface 49 elevationally over active region 18 in second substrate region 14 (FIGS. 2 and 3). Further, active material 13 of active region 18 may be considered as comprising an elevationally outer surface 48 (in one embodiment a top surface 48) in second substrate region 14. In one embodiment, top surface 47 is lower in substrate 10 than elevationally outer surface 48 and top surface 49 is higher in substrate 10 than elevationally outer surface 48.

Regardless, in one embodiment, conductive line 45a comprises a conductive composition 46 that is common in conductive line 45a within first substrate region 12 and within second substrate region 14. In other words in such embodiment, composition of conductive line 45a within second region 14 and at least where conductive line 45a crosses from first region 12 into second region 14 is of uniform composition (i.e., is not of differing chemical composition relative to regions 12 and 14 where so crossing). Conductive composition 46 may be any one or more of elemental metal, an alloy of two or more elemental metals, conductive metal compounds, and conductively doped semiconductive material. But one example includes a TiN liner having elemental tungsten as a fill material there-against. Conductive line 45a may be externally lined with an insulator (not shown), for example a gate dielectric where conductive line 45a may comprise a gate line of a plurality of transistors. In one embodiment, common conductive composition 46 of conductive line 45 has a maximum elevational thickness $T_2$ in second substrate region 14 that is greater than a maximum elevational thickness $T_1$ of common conductive composition 46 of conductive line 45a in first substrate region 12 (i.e., independent of elevational positions of surfaces 49 and 47 relative to surface 48). In one embodiment and as shown, a plurality of such conductive lines 45a-f has been formed and which comprise buried access transistor gate lines of a memory array. In such embodiment, by way of example only, source/drain regions (not shown) may be formed proximate outer surfaces of active material 13 within substrate area 12 and storage elements (not shown; e.g., capacitors) may electrically couple thereto.

Dielectric material 52 is elevationally outward of base 11. Example materials include one or more of silicon nitride 53 and silicon dioxide 55, whether doped or undoped. Materials 52, 53, and 55 are not shown in FIG. 1 for clarity in FIG. 1. In one embodiment, dielectric material 55 in second substrate region 14 has a top surface 61 that is substantially elevationally coincident with higher top surface 49 of conductive line 45a. A plurality of conductive lines 56a, 56b, 56c, and 56d (e.g., sense lines or bit lines associated with memory circuitry) may also be formed, for example as shown.

In one embodiment, a conductive via 50 extends elevationally inward at least to the elevation of higher top surface 49 of conductive line 45a elevationally over active region 18 in second substrate region 14. Conductive via 50 may be of the same or different composition from that of material 46, and ideally will be of different composition from that of material 26. As used herein, "different composition" only requires those portions of two stated materials or regions that may be directly against one another to be chemically and/or physically different, for example if such materials are not homogenous. If the two stated materials or regions are not directly against one another, "different composition" only requires that those portions of the two stated materials or regions that are closest to one another be chemically and/or physically different if such materials or regions are not homogenous. In this document, a material or structure or region is "directly against" another when there is at least some physical touching contact of the stated materials or structures or regions relative one another. In contrast, "over", "on", and "against" not preceded by "directly", encompass "directly against" as well as construction where intervening material(s) or structure(s) or region(s) result(s) in no physical touching contact of the stated materials or structures or regions relative one another. As one example, conductive via 50 includes a TiN liner having elemental tungsten as a fill material there-against. In one embodiment, conductive via 50 has a minimum cross dimension that is smaller than minimum cross dimension of higher top surface 49 in a first direction (e.g., along line 2-2 in FIG. 1) and larger than minimum cross dimension of higher top surface 49 in a second direction (e.g., along 16-16 in FIG. 1) that is substantially perpendicular to the first direction.

In one embodiment, conductive vias 59 extend elevationally inward to lines 56a-d and may have any of the attributes described above with respect to vias 50. Conductive vias 59 (not shown) for lines 56b and 56d may be formed on an opposite side of first substrate region 12 from that shown in FIGS. 1-3. Contact openings may be etched into material 52 at the same time for ultimate formation of vias 50 and 59, as referred to above.

In one embodiment, substrate 10 is devoid of any trench isolation region within semiconductor material 13 laterally between first isolation region 16 and second isolation region 20 in a straight-line vertical cross section of substrate 10 (e.g., the cross section shown by FIG. 2). In such embodiment, a conductive via 50 extends elevationally inward to conductive line 45a elevationally over active region 18 in second substrate region 14 in such straight-line vertical cross section and thereby is not elevationally over any trench isolation region of substrate 10. Regardless, in one embodiment, conductive via 50 extends elevationally inward to a portion of conductive line 45a that comprises the common conductive composition (e.g., 46) of maximum elevational thickness (e.g., that portion of material 46 of thickness $T_2$) elevationally over active region 18 in second substrate region 14 (i.e., regardless of whether conductive via 50 is elevationally over any trench isolation region of the substrate). In one embodiment, conductive via 50 has a minimum cross dimension that is smaller than minimum cross dimension of such portion of the conductive line in a first direction (e.g., along line 2-2 in FIG. 1) and larger than minimum cross dimension of such portion of the conductive line in a second direction (e.g., along 16-16 in FIG. 1) that is substantially perpendicular to the first direction.

Figure 4:
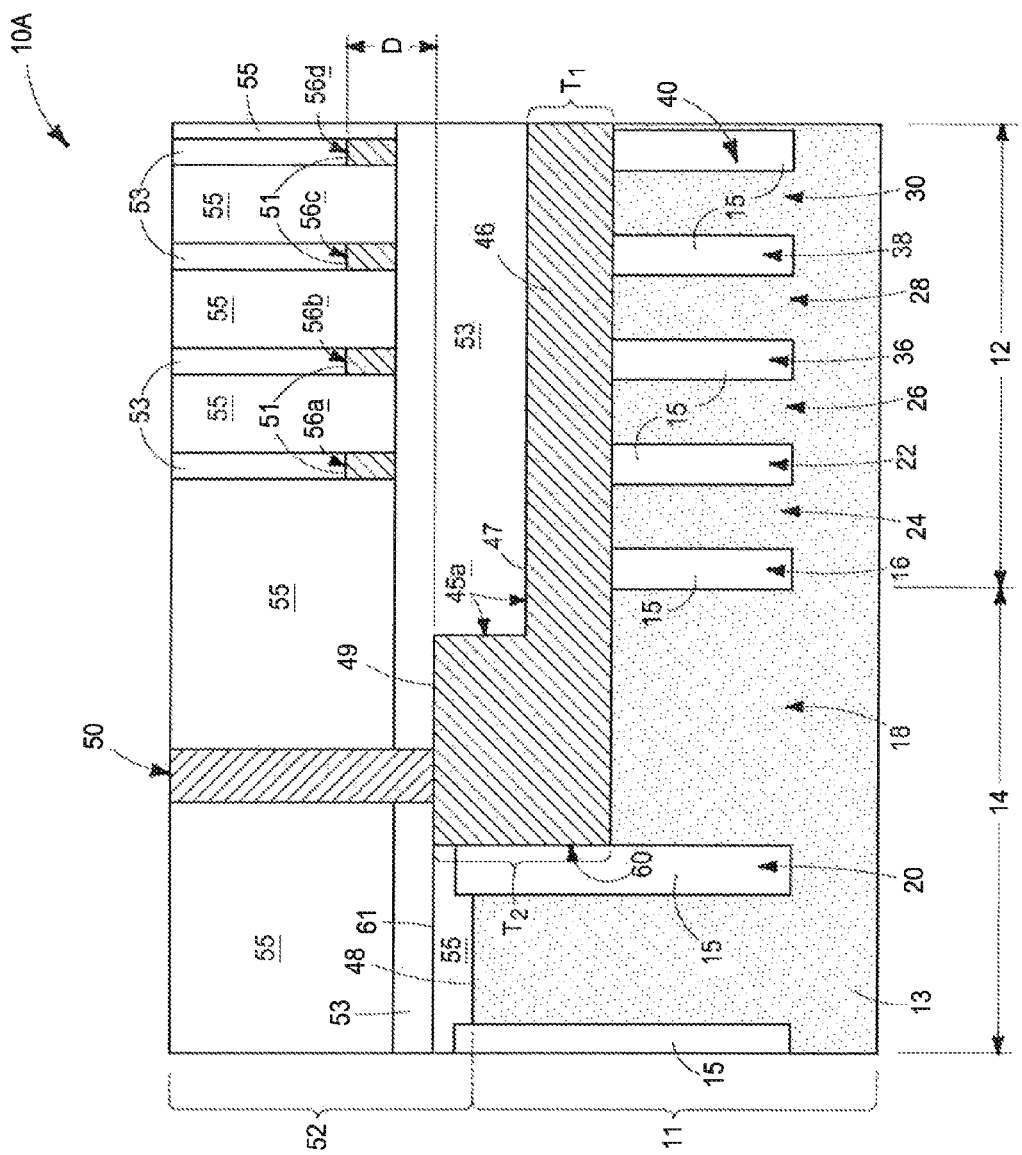
FIG. 4 is a diagrammatic sectional view of a substrate fragment comprising a portion of a semiconductor device in accordance with an embodiment of the invention.
Figure 5:
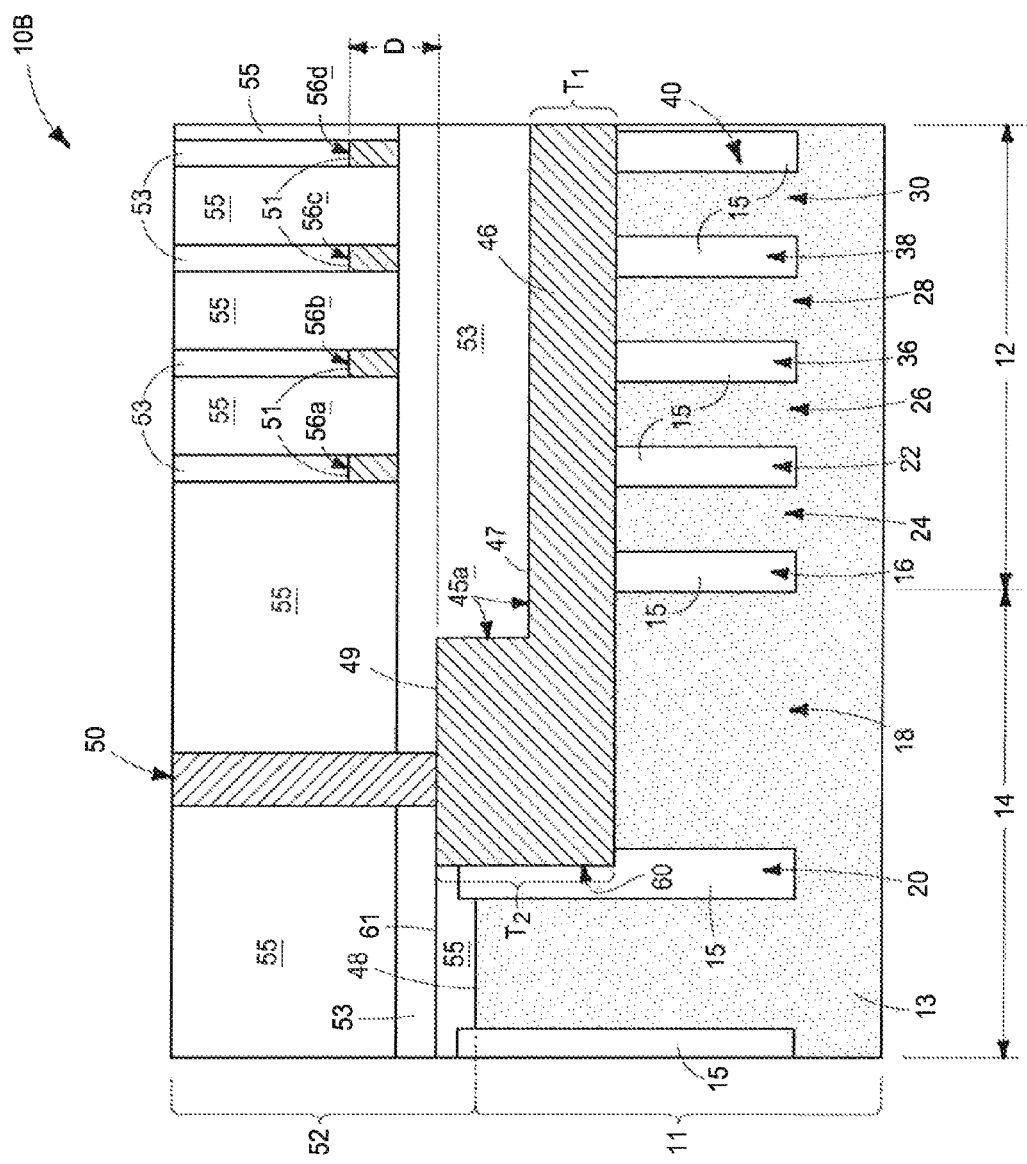
FIG. 5 is a diagrammatic sectional view of a substrate fragment comprising a portion of a semiconductor device in accordance with an embodiment of the invention.

FIG. 2 shows an example embodiment wherein conductive line 45a has a longitudinal end 60 that is laterally spaced from second isolation region 20 at least by active material 13. FIG. 4 depicts an alternate embodiment substrate 10A to that shown by FIG. 2. Like numerals from the above-described embodiments have been used where appropriate, with some construction differences being indicated with the suffix "A". In the FIG. 4 device, conductive line 45a comprises a longitudinal end 60 that is not laterally spaced from second isolation region 20 at least by active material 13. FIG. 5 depicts another example embodiment substrate 10B wherein conductive line 45a has a longitudinal end 60 that extends laterally into second isolation region 20 and is also thereby not laterally spaced from second isolation region 20 at least by active material 13. Like numerals from the above-described embodiments have been used where appropriate, with some construction differences being indicated with the suffix "B". Where line 45a extends to or into second isolation region 20, conductive material of line 45a may or may not be directly against insulator material 15 of second isolation region 20, for example depending on whether a gate dielectric material lines such conductive material. Any other attribute(s) or aspect(s) as described above and/or shown in the Figures may be used in the FIGS. 4 and 5 embodiments.

Figure 6:
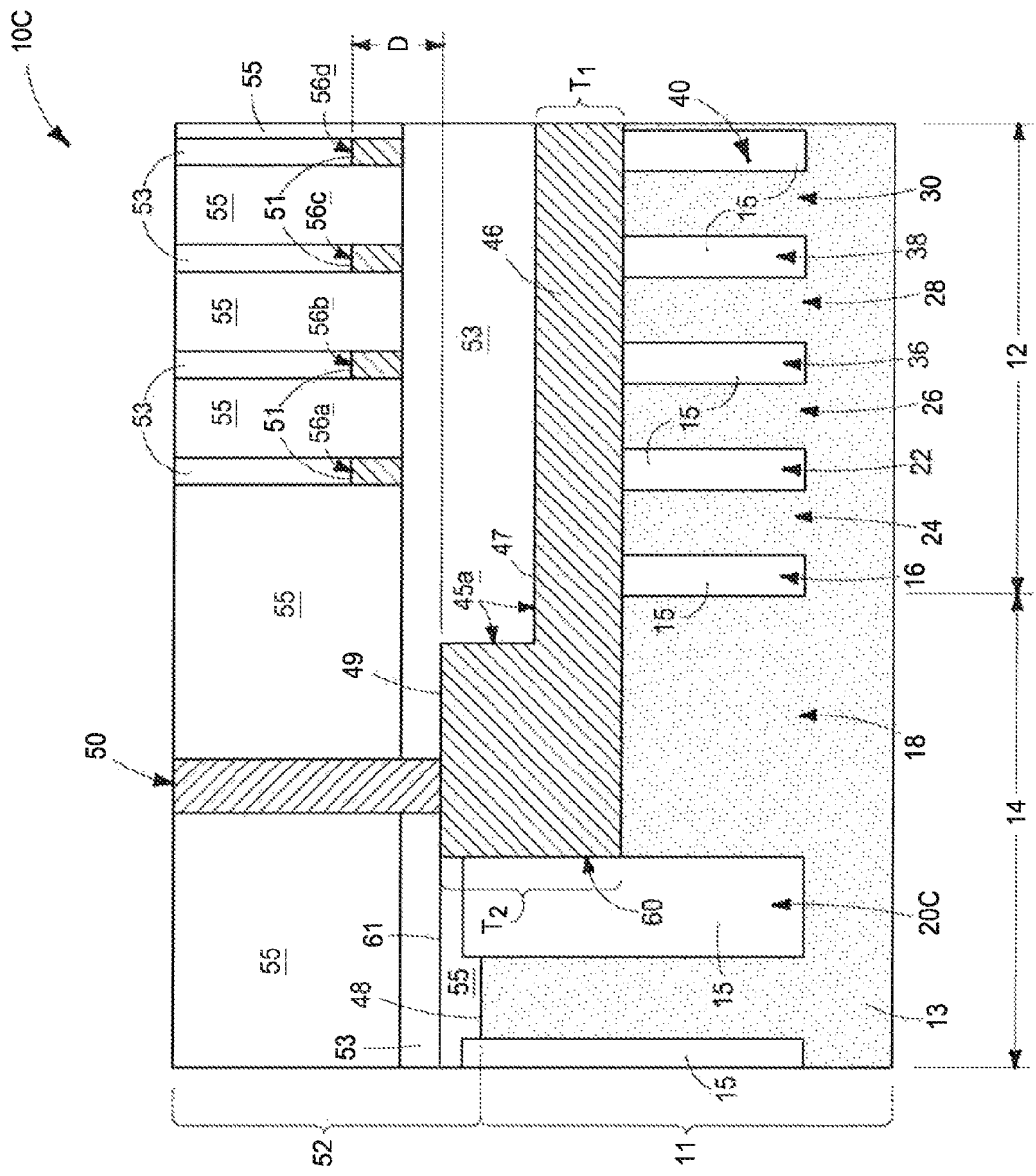
FIG. 6 is a diagrammatic sectional view of a substrate fragment comprising a portion of a semiconductor device in accordance with an embodiment of the invention.

Any suitable width may be selected for the depicted isolation regions, with substrate 10C in FIG. 6 showing a wider second isolation region 20C in comparison with that shown in FIGS. 1-5. Like numerals from the above-described embodiments have been used where appropriate, with some construction differences being indicated with the suffix "C". Any other attribute(s) or aspect(s) as described above and/or shown in the Figures may be used.

Figure 7:
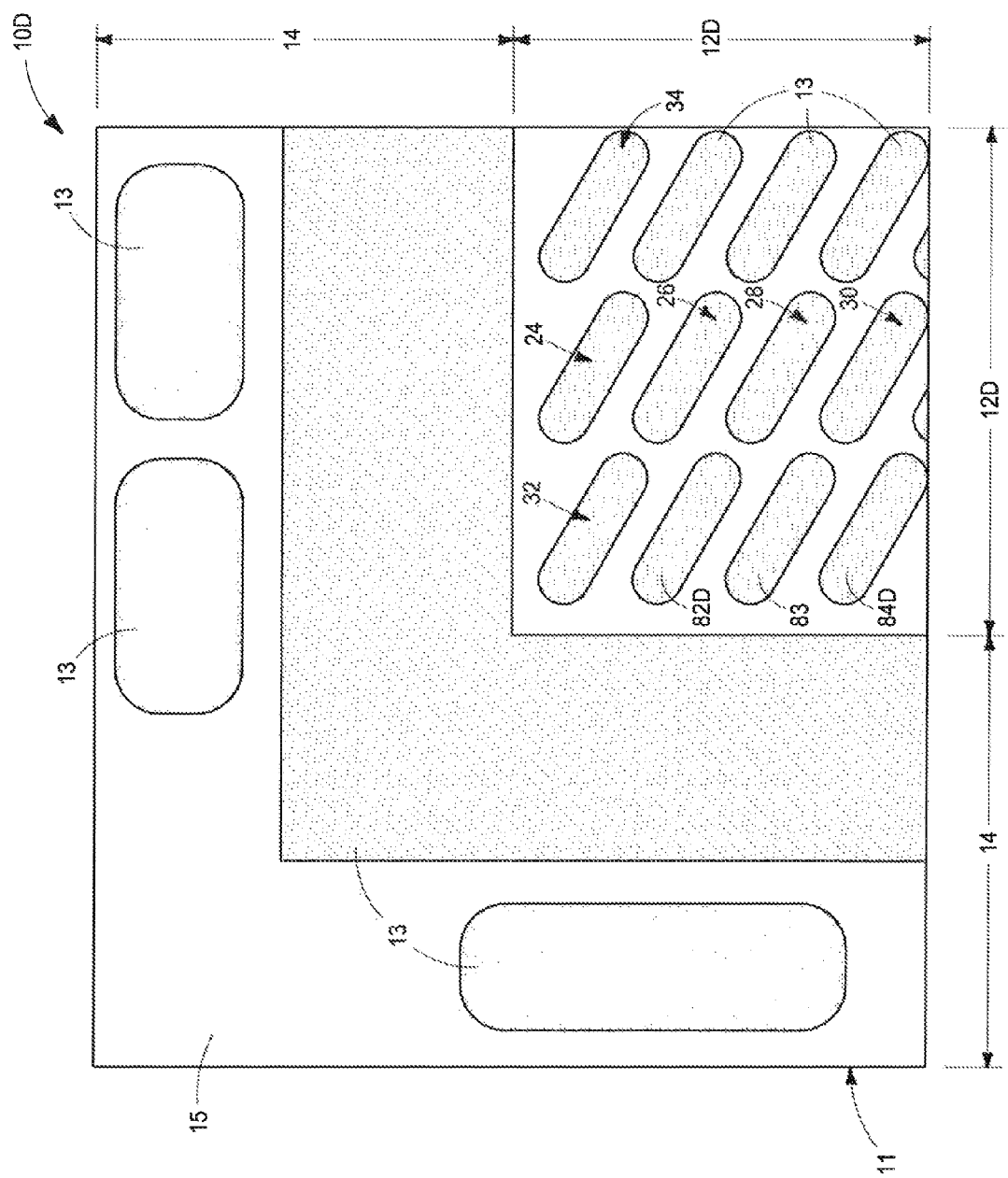
FIG. 7 is a diagrammatic top plan view of a substrate fragment comprising a portion of a semiconductor device in accordance with an embodiment of the invention.

FIG. 1 shows an example embodiment having peripheral active regions 77, 79, 81, 82, and 84 in first substrate region 12 that extend laterally to join with active material 13 that comprises active region 18 in second substrate region 14. FIG. 7 shows an example alternate embodiment substrate 10D wherein the peripheral active regions in first substrate region 12D are everywhere laterally spaced by isolation material 15 from active material 13 that comprises active region 18 in second substrate region 14. Like numerals from the above-described embodiments have been used where appropriate, with some construction differences being indicated with the suffix "D". For clarity in FIG. 7, conductive lines 45a-f, 56a-d, and conductive vias 50, 59 are not shown. Any other attribute(s) or aspect(s) as described above and/or shown in the Figures may be used.

Figure 8:
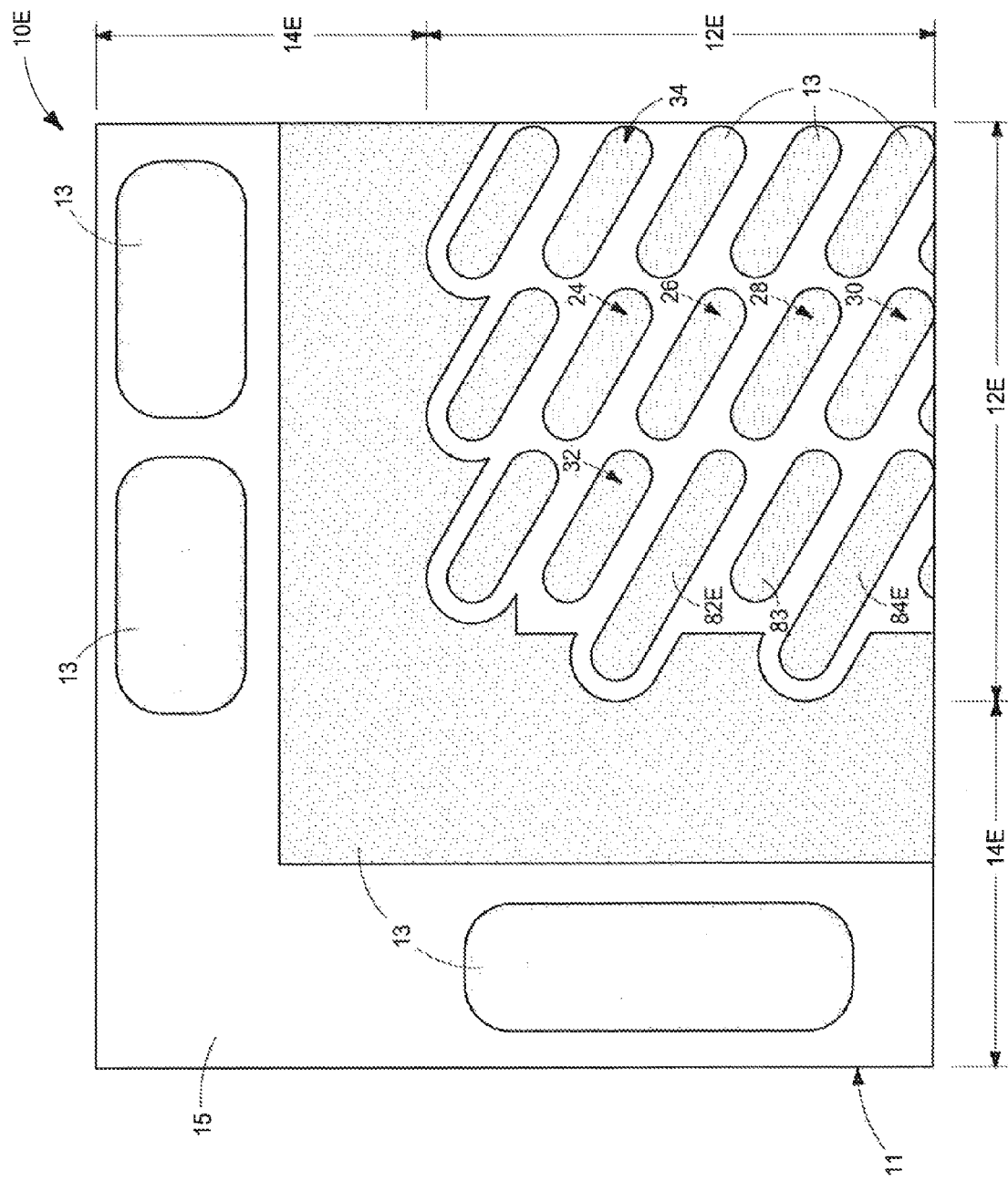
FIG. 8 is a diagrammatic top plan view of a substrate fragment comprising a portion of a semiconductor device in accordance with an embodiment of the invention.

FIG. 8 discloses yet another example alternate embodiment substrate 10E. Like numerals from the above-described embodiments have been used where appropriate, with some construction differences being indicated with the suffix "E". FIG. 8 shows a construction which may result from using pitch multiplication techniques and where, again, the peripheral active regions in first substrate region 12E are everywhere laterally spaced from active material 13 that comprises active region 18 in second substrate region 14E. Again, for clarity in FIG. 8, conductive lines 45a-f, 56a-d, and conductive vias 50, 59 are not shown. Any other attribute(s) or aspect(s) as described above and/or shown in the Figures may be used.

The active region layouts and spacings as shown in FIGS. 1-8 are examples only. Alternates may of course be used, and whether existing or yet-to-be-developed.

Figure 9:
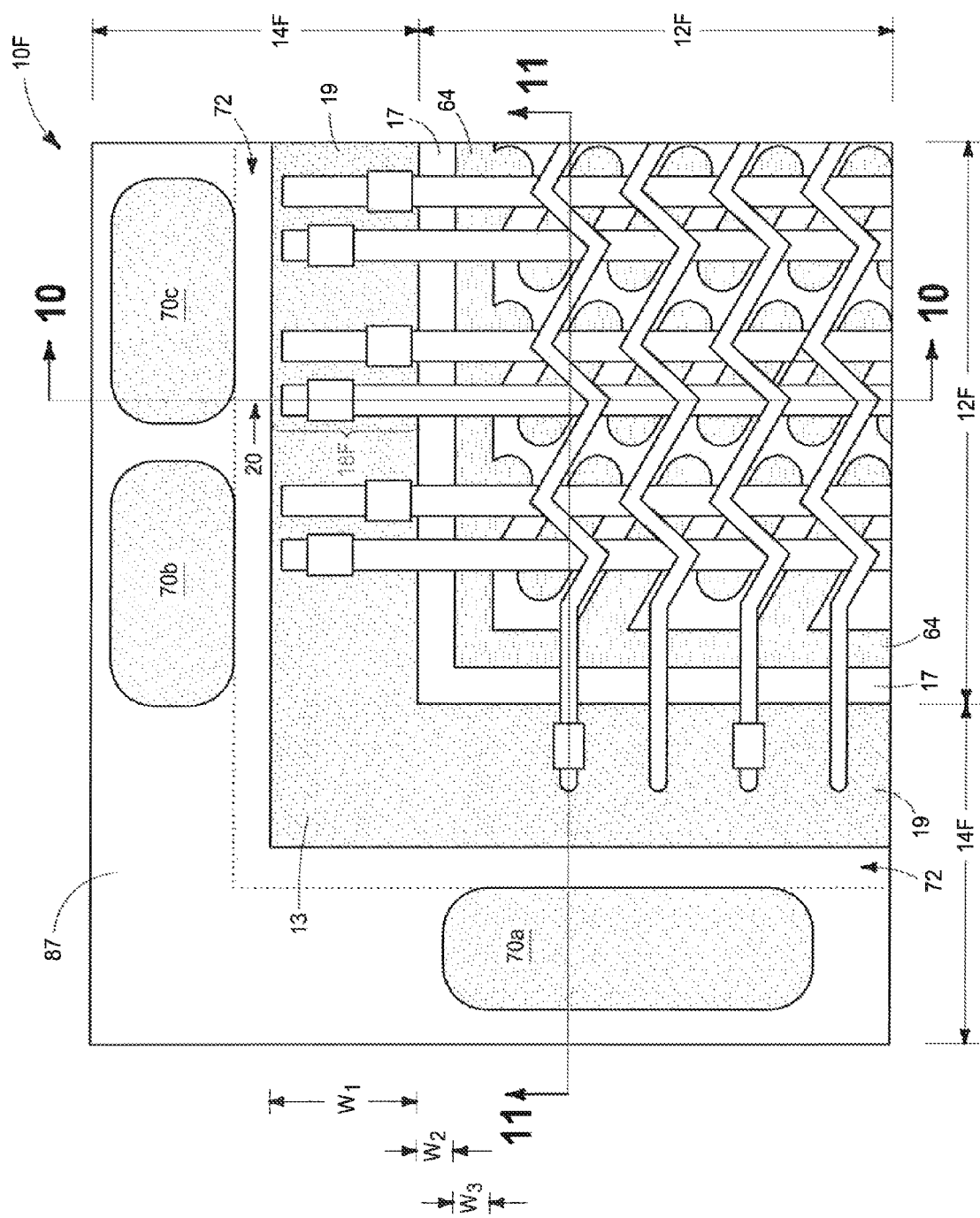
FIG. 9 is a diagrammatic top plan view of a substrate fragment comprising a portion of a semiconductor device in accordance with an embodiment of the invention.
Figure 10:
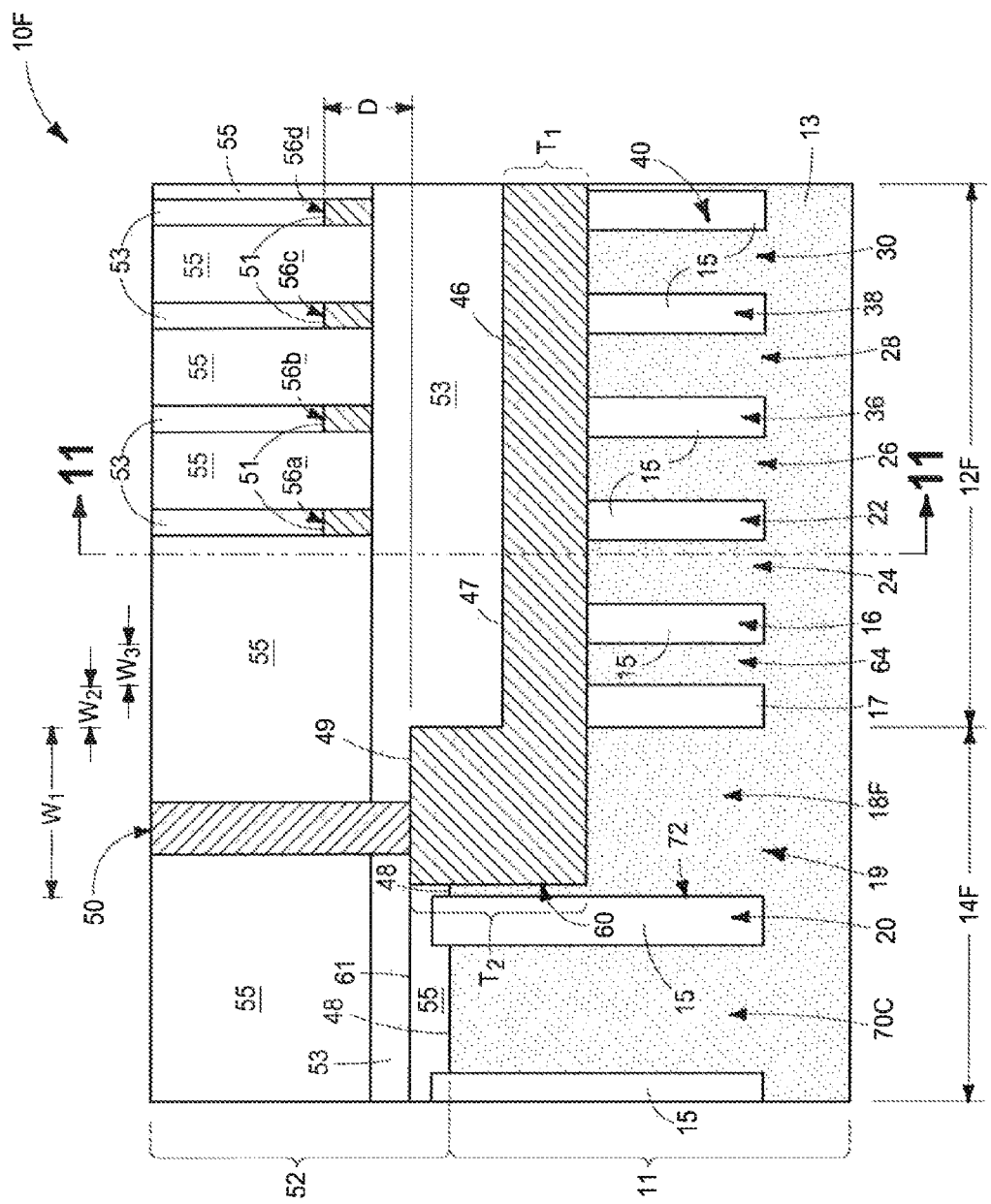
FIG. 10 is a sectional view taken through line 10-10 in FIG. 9 and FIG. 11.
Figure 11:
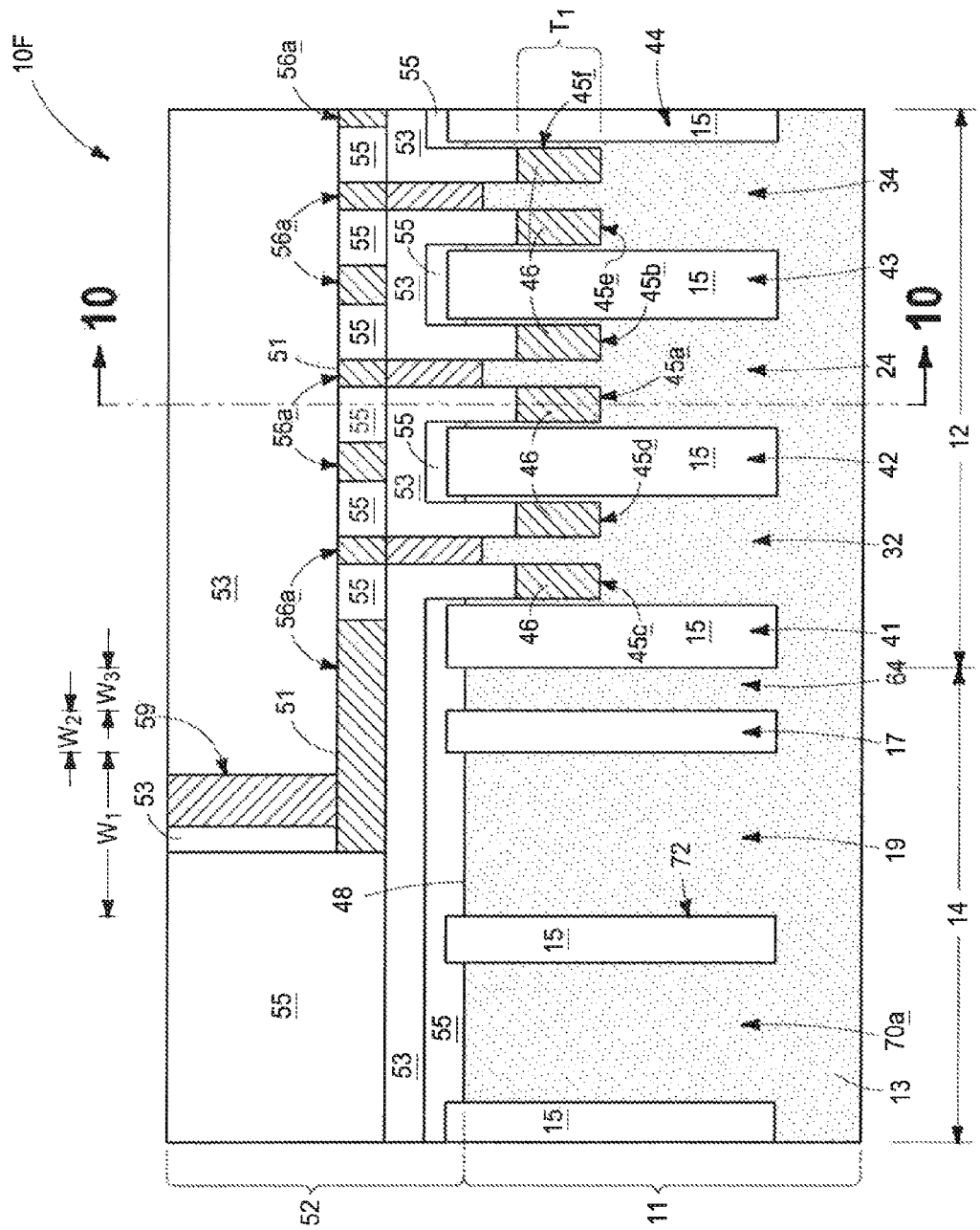
FIG. 11 is a sectional view taken through line 11-11 in FIG. 9 and FIG. 10.

Another example alternate embodiment substrate 10F in accordance with some embodiments of the invention is next described with reference to FIGS. 9-11. Like numerals from the above-described embodiments have been used where appropriate, with some construction differences being indicated with the suffix "F". Different or additional numerals are also used for some construction differences or to emphasize features. The semiconductor device of substrate 10F incorporates many of the aspects described above. Additionally, in one embodiment, first substrate region 12F comprises an array circuitry region having an annular first semiconductor region 64 (example width of about 700 Angstroms) and having a perimeter comprising an annular radially inner isolation region 17 (example width of about 800 to 1,500 Angstroms) that is adjacent to and encircles annular first semiconductor region 64 in first substrate region 12F. In one embodiment, isolation region 17 may be considered as a third isolation region in first substrate region 12F and that is laterally spaced from first isolation region 16. Active material 13 may be considered as comprising an annular second semiconductor region 19 (which includes active region 18F) in peripheral circuitry region 14F radially outward of, adjacent to, and encircling annular radially inner isolation region 17 of array circuitry region 12F. In one embodiment, annular second semiconductor region 19 is circumferentially-continuous about annular radially inner isolation region 17, for example as shown.

In one embodiment, peripheral circuitry region 14F may be considered as comprising an annular radially outer isolation region 87 that is radially outward of, adjacent to, and encircling annular second semiconductor region 19. In one embodiment, annular radially outer isolation region 87 in peripheral circuitry region 14F comprises active regions 70a, 70b, and 70c therein that are circumferentially spaced from one another about annular second semiconductor region 19 (i.e., they are not circumferentially-continuous about annular second semiconductor region 19). In one embodiment, annular radially outer isolation region 87 comprises a circumferentially-continuous radially inner portion 72 encircling annular second semiconductor region 19.

In one embodiment, annular second semiconductor region 19 has a minimum radial width $W_1$ proximate tops of annular radially inner and outer isolation regions 17 and 87, respectively, that is greater than minimum radial width $W_2$ of annular radially inner isolation region 17 proximate tops of annular radially inner and outer isolation regions 17 and 87, respectively. In one embodiment, annular second semiconductor region 19 has a minimum radial width $W_1$ proximate tops of annular radially inner and outer isolation regions 17 and 87, respectively, that is greater than minimum radial width $W_3$ of annular first semiconductor region 64 proximate tops of annular radially inner and outer isolation regions 17 and 87, respectively. Any other attribute(s) or aspect(s) as described above and/or shown in the Figures may be used.

Figure 12:
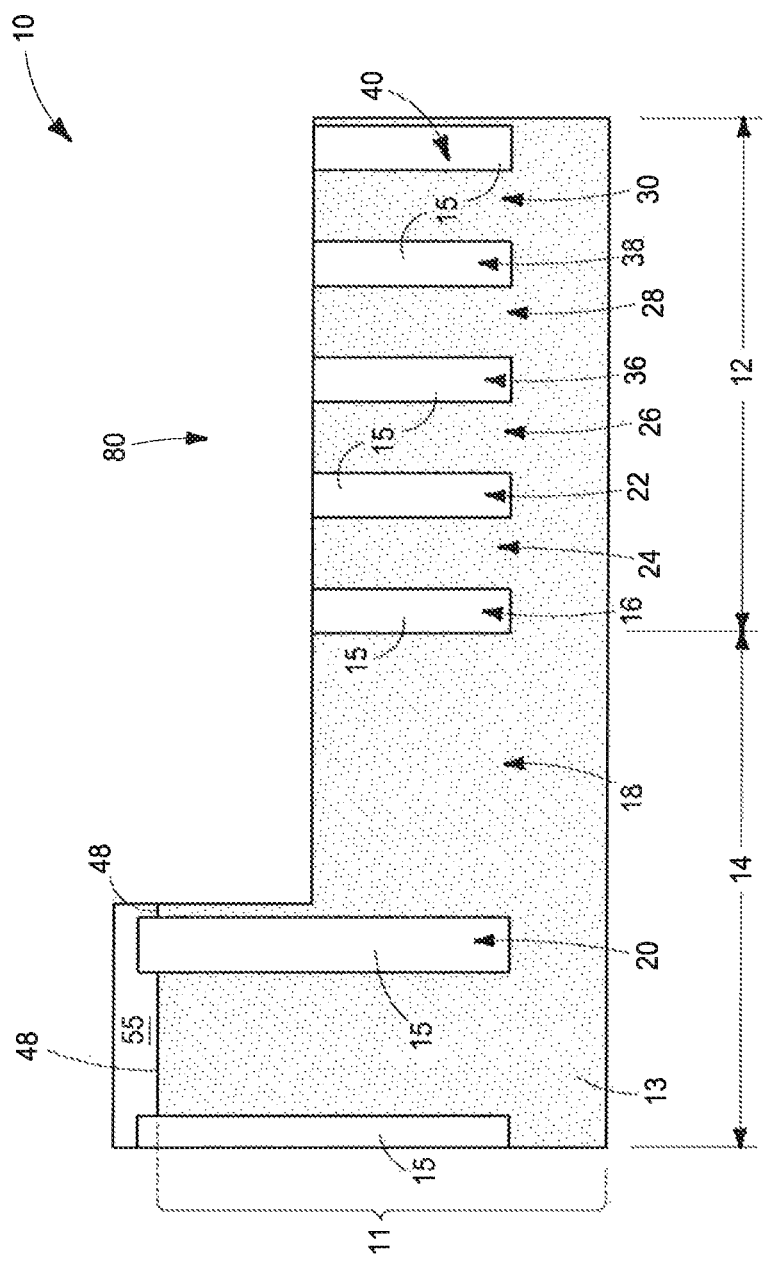
FIG. 12 is a diagrammatic sectional view of substrate fragment in process.
Figure 13:
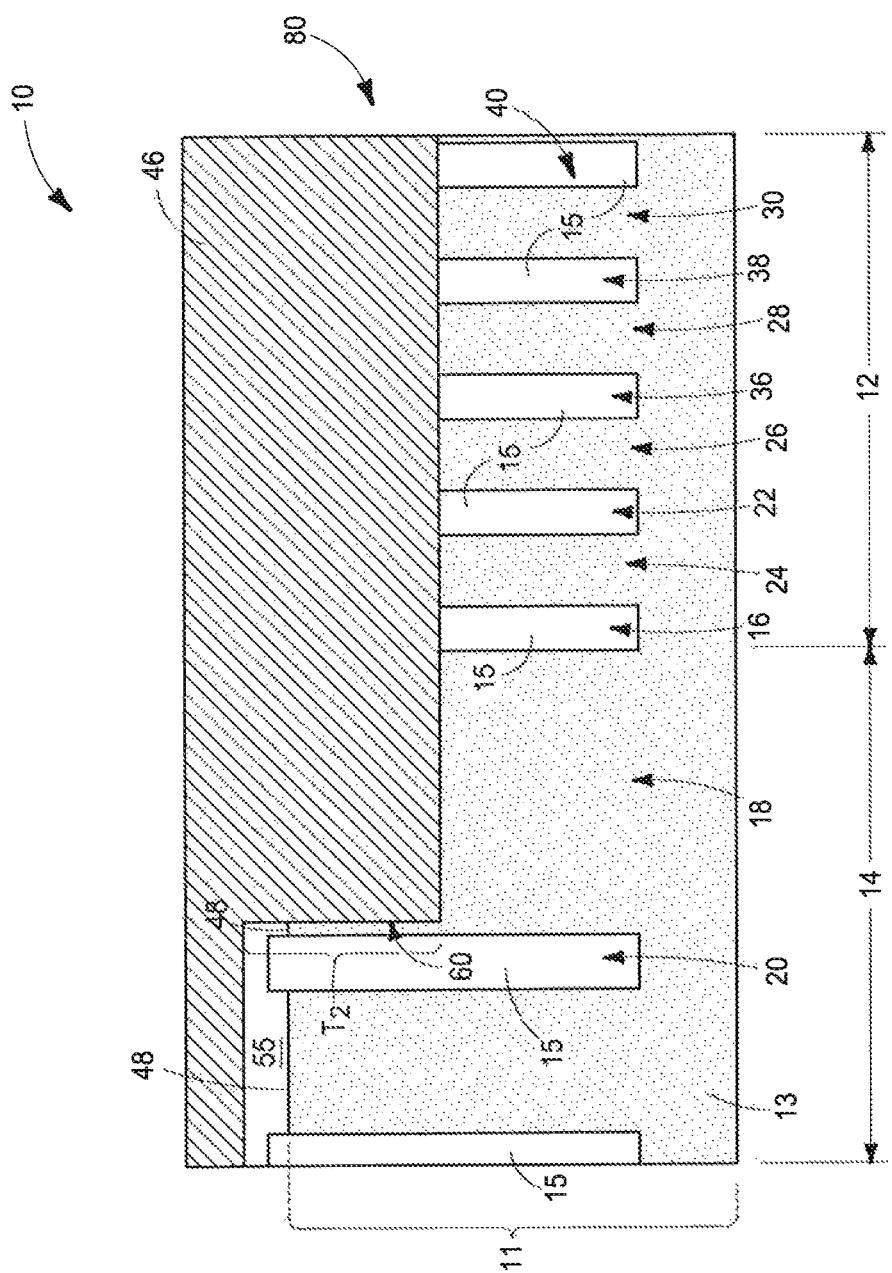
FIG. 13 is a view of the FIG. 12 substrate fragment at a processing step subsequent to that shown by FIG. 12.
Figure 14:
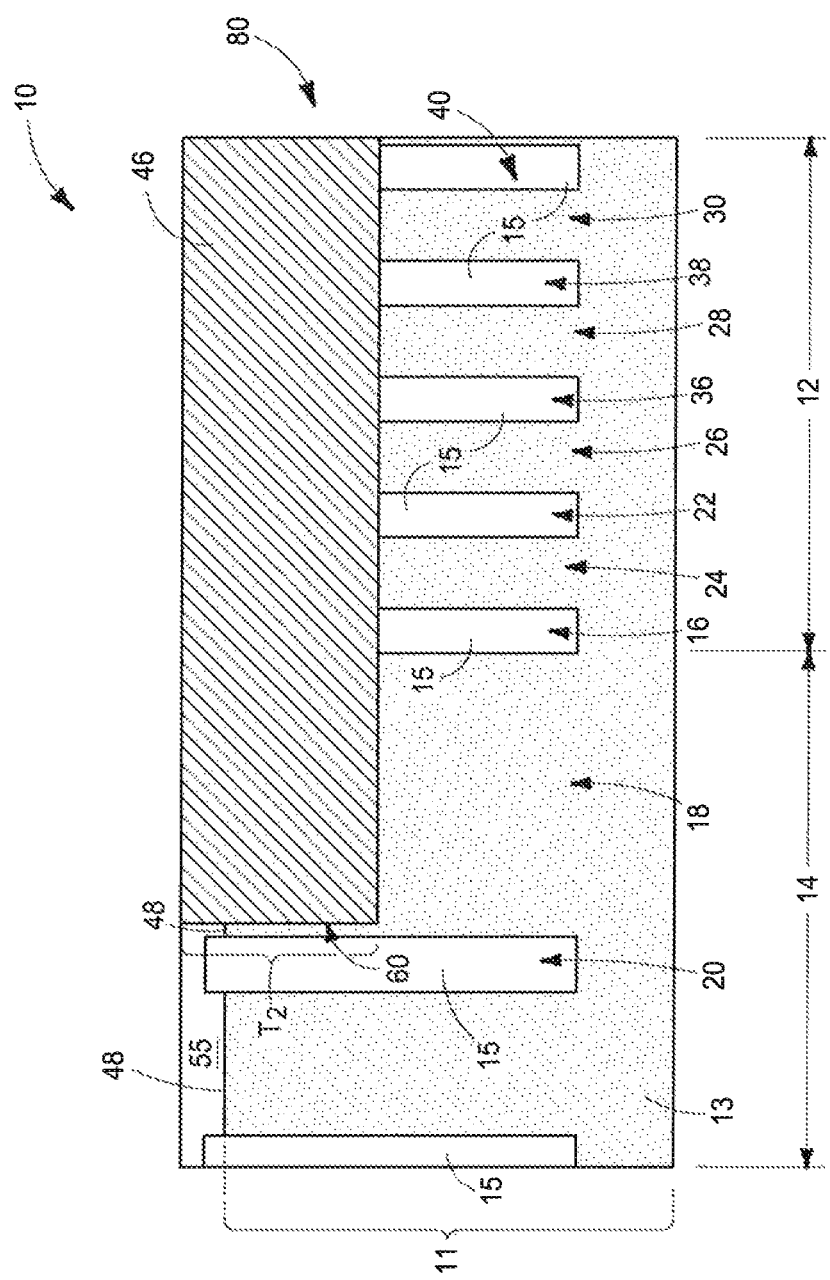
FIG. 14 is a view of the FIG. 13 substrate fragment at a processing step subsequent to that shown by FIG. 13.

Embodiments as disclosed herein may be manufactured using any existing or yet-to-be-developed manufacturing techniques. One example ideal technique for manufacturing conductive lines 45a-f is briefly described with reference to FIGS. 12-15. Like numerals from the above-described embodiments have been used where appropriate. FIG. 12 shows a predecessor to substrate 10 in process for ultimately producing substrate 10 as shown in FIG. 2. Material 55 has been used as hard masking material of a mask while etching a trench 80 into substrate 11. Trench 80 may largely correspond in size and shape to an individual conductive line 45a-f to be formed. FIG. 13 shows conductive composition 46 having been deposited within trench 80. FIG. 14 shows subsequent polish or etch-back of material 46 at least to an elevationally outermost surface of material 55.

Figure 15:
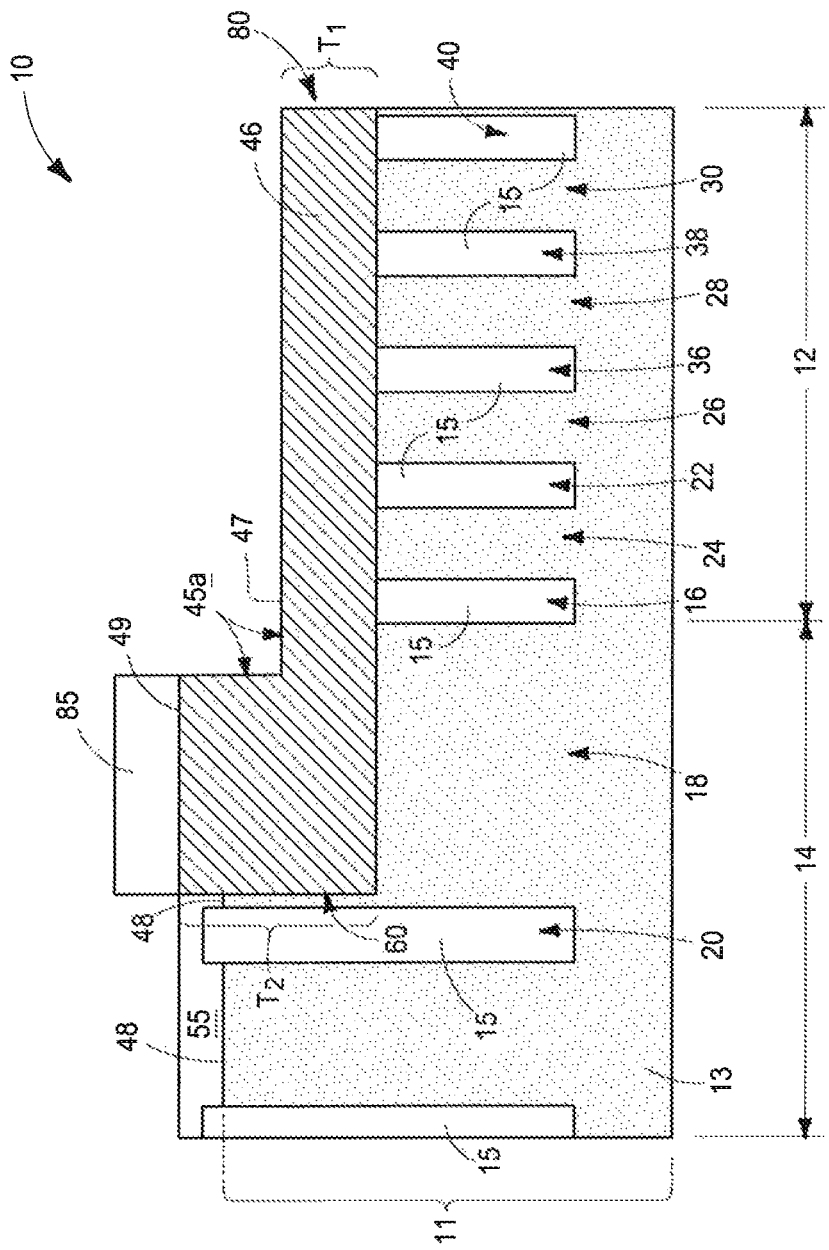
FIG. 15 is a view of the FIG. 14 substrate fragment at a processing step subsequent to that shown by FIG. 14.

Referring to FIG. 15, a mask 85 (e.g., photoresist) has been formed elevationally over conductive composition 46 to correspond with the outline of the thicker portion of conductive line 45a (e.g., that portion of material 46 of thickness $T_2$ in FIG. 2). Material 46 has then been etched elevationally inward, for example using a timed etch, to form a desired construction of line 45a.

CONCLUSION

In some embodiments, a semiconductor device comprises a substrate comprising laterally-adjacent first and second substrate regions. A first isolation region is at least in the first substrate region. An active region is at least in the second substrate region. The active region is laterally adjacent to the first isolation region. A conductive line extends from the first substrate region into the second substrate region. The conductive line is elevationally over the first isolation region and elevationally over the active region. A top surface of the conductive line elevationally over the first isolation region in the first substrate region is lower in the substrate than an elevationally outer surface of active material of the active region in the second substrate region. A top surface of the conductive line elevationally over the active region in the second substrate region is higher in the substrate than the elevationally outer surface of the active material of the active region in the second substrate region. A conductive via extends elevationally inward at least to elevation of the higher top surface of the conductive line elevationally over the active region in the second substrate region.

In some embodiments, a semiconductor device comprises a substrate comprising laterally-adjacent first and second substrate regions. An isolation region is at least in the first substrate region. An active region is at least in the second substrate region. The active region is laterally adjacent to the isolation region. A conductive line extends from the first substrate region into the second substrate region. The conductive line is elevationally over the isolation region and elevationally over the active region. The conductive line comprises a conductive composition that is common in the conductive line within the first and second substrate regions. The common conductive composition of the conductive line has a maximum elevational thickness in the second substrate region that is greater than maximum elevational thickness of the common conductive composition of the conductive line in the first substrate region.

In some embodiments, a semiconductor device comprises a substrate comprising laterally-adjacent first and second substrate regions. A first trench isolation region is at least in the first substrate region. A second trench isolation region is at least in the second substrate region. An active region is at least in the second substrate region. The active region laterally spans between and is laterally adjacent to the first and second trench isolation regions. A conductive line extends from the first substrate region into the second substrate region. The conductive line is elevationally over the first trench isolation region and elevationally over the active region. The substrate is devoid of any trench isolation region within semiconductor material laterally between the first and second trench isolation regions in a straight-line vertical cross section of the substrate. A conductive via extends elevationally inward to the conductive line elevationally over the active region in the second substrate region in said straight-line vertical cross section and thereby is not elevationally over any trench isolation region of the substrate.

In some embodiments, a semiconductor device comprises a substrate comprising an array circuitry region and a peripheral circuitry region encircling the array circuitry region. The array circuitry region comprises an annular first semiconductor region and a perimeter comprising an annular radially inner isolation region that is adjacent to and encircles the annular first semiconductor region. An annular second semiconductor region is in the peripheral circuitry region radially outward of, adjacent to, and encircling the annular radially inner isolation region perimeter of the array circuitry region. An annular radially outer isolation region is in the peripheral circuitry region radially outward of, adjacent to, and encircling the annular second semiconductor region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A semiconductor device comprising:
   a substrate comprising laterally-adjacent first and second substrate regions;
   a first isolation region that is at least in the first substrate region;
   an active region that is at least in the second substrate region, the active region being laterally adjacent to the first isolation region;
   a conductive line extending from the first substrate region into the second substrate region, the conductive line being elevationally over the first isolation region and elevationally over the active region, a top surface of the conductive line elevationally over the first isolation region in the first substrate region being lower in the substrate than an elevationally outer surface of active material of the active region in the second substrate region, a top surface of the conductive line elevationally over the active region in the second substrate region being higher in the substrate than the elevationally outer surface of the active material of the active region in the second substrate region; and
   a conductive via extending elevationally inward at least to elevation of the higher top surface of the conductive line elevationally over the active region in the second substrate region.

2. The semiconductor device of claim 1 comprising a dielectric material in the second substrate region having a top surface that is substantially elevationally coincident with the higher top surface of the conductive line that is elevationally over the active region in the second substrate region.

3. The semiconductor device of claim 1 comprising a second isolation region in the second substrate region.

4. The semiconductor device of claim 3 wherein the conductive line has a longitudinal end that is laterally spaced from the second isolation region at least by active material of the substrate.

5. The semiconductor device of claim 3 wherein the conductive line has a longitudinal end that is not laterally spaced from the second isolation region at least by active material of the substrate.

6. The semiconductor device of claim 5 wherein the conductive line extends laterally into the second isolation region.

7. The semiconductor device of claim 3 comprising a third isolation region in the first substrate region and that is laterally spaced from the first isolation region.

8. The semiconductor device of claim 1 wherein the first isolation region is not in the second substrate region and comprising a second isolation region in the second substrate region that is laterally spaced from the first isolation region.

9. The semiconductor device of claim 1 wherein the active region is in the first substrate region.

10. The semiconductor device of claim 1 wherein the active region is not in the first substrate region.

11. The semiconductor device of claim 1 wherein the conductive via has a minimum cross dimension that is smaller than minimum cross dimension of the higher top surface in a first direction and larger than minimum cross dimension of the higher top surface in a second direction that is substantially perpendicular to the first direction.

12. The semiconductor device of claim 1 wherein the first substrate region comprises an array circuitry region and the second substrate region comprises a peripheral circuitry region encircling the array circuitry region;
   the array circuitry region comprising an annular first semiconductor region and a perimeter comprising an annular radially inner isolation region that is adjacent to and encircles the annular first semiconductor region;
   an annular second semiconductor region in the peripheral circuitry region radially outward of, adjacent to, and encircling the annular radially inner isolation region of the array circuitry region; and
   an annular radially outer isolation region in the peripheral circuitry region radially outward of, adjacent to, and encircling the annular second semiconductor region.

* * * * *